United States Patent [19]
Baker

[11] 4,017,803
[45] Apr. 12, 1977

[54] DATA RECOVERY SYSTEM RESISTANT TO FREQUENCY DEVIATIONS

[75] Inventor: Kenneth L. Baker, Norristown, Pa.

[73] Assignee: Sperry Rand Corporation, New York, N.Y.

[22] Filed: Jan. 29, 1976

[21] Appl. No.: 653,410

[52] U.S. Cl. ............................ 329/104; 325/346; 329/50; 329/122; 328/109

[51] Int. Cl.² ................................. H03D 3/18

[58] Field of Search ............ 329/104, 107, 50, 122; 328/63, 109; 325/346, 419

[56] References Cited
UNITED STATES PATENTS

3,825,844   7/1974   Peterman et al. ................. 329/104

*Primary Examiner*—John Kominski
*Attorney, Agent, or Firm*—Alfred Stapler

[57] ABSTRACT

The data stream input to the recovery logic is taken from a point at which its transitions are timecoincident with those of the data stream input to the phase comparator of the phase locked oscillator loop used to control the generation of the recovery windows. No delay is provided between the data stream take-off point and its input to the recovery logic. The PLO and the window generating circuits cooperate to maintain data and clock representative transitions in the data stream applied to the recovery logic centered in the respective windows.

25 Claims, 7 Drawing Figures

DATA RECOVERY SYSTEM RESISTANT TO FREQUENCY DEVIATIONS

The invention relates to improved circuitry for recovering binary data serially presented in a data stream. Such data may be derived from a magnetic medium, such as a magnetic recording disc, from a communications channel, or from any other source.

It is well known that such data can be recovered by generating so-called windows, to coincide with the times at which the individual components of the data stream (such as ones, zeros, clock, etc.) can be expected to occur, and utilizing these windows to gate these data components out of the composite data stream.

Such windows are generated by means of a phase-locked oscillator (PLO), which is controlled by the data stream itself, so that the windows produced correspond appropriately to the rate and times of occurrence of the data components.

The recovery procedure utilizing such PLO-produced windows is quite delicate. In particular, it is important that the position of the data components to be recovered be maintained as closely as possible centered within their respective windows. This is important regardless of the type of data encoding used. It is especially important for certain sophisticated types of data encoding, such as M²FM. This term denotes a type of FM encoding, characterized in that "one" data bits are represented by a pulse at the center of a timing interval (bit cell) and "zero" bits are represented by a pulse at the boundary of a timing interval. For each one data bit, there is a pulse, but for zero data bits there is a pulse only when neither a one nor a zero pulse is present in the immediately preceding timing interval and no data pulse occurs in the timing interval immediately following the boundary in question. The minimum interval T between pulses occurs for successive one bits. The maximum interval between pulses is then 2.5T, and occurs for a 1 bit following three successive zero bits or still higher odd multiples of such successive zero bits. Intervals of 1.5T and 2T between successive pulses can also occur depending upon the bit pattern.

By virtue of the coding rules which apply to such an M²FM code, the pulses at the boundaries of the timing intervals represent not only zeros, but also so-called "clock" information. This is timing information which denotes overall message timing, such as starts by bytes, words and messages, and is used for over-all synchronization of the data utilization system for which the ones and zeros provide the detailed data content. The recovery system must therefore also make provision for recovering the clock information which forms part of the data stream. This means that, in the recovery system, the zero-representing pulses cannot be ignored, but must also be recovered, in addition to the one-representing pulses. The windows which are generated for recovery need to be suited for this purpose, too.

The typical phase-locked oscillator for generating the windows needed to so recover M²FM or other coded signals consists of a closed loop-circuit arrangement, which includes a voltage-controlled oscillator for generating the desired output signals. This voltage-controlled oscillator receives its control signal from a filter. The filter, in turn, is supplied with the output of a phase comparator. One input to this phase comparator is derived through feedback from the oscillator itself, the other is derived from the external signal, to which the phase-locked oscillator is to be locked. The operation of the phase-locked oscillator is such that a fixed phase relationship (e.g. one of phase coincidence) tends to be maintained between certain parameters of the two input signals to the phase comparator.

Problems have been encountered in attempting to use such phase-locked oscillators in recovering data.

In using a phase-locked oscillator to generate the windows needed for recovery, it has been the practice to employ the data stream as the external signal controlling the voltage-controlled oscillator (via the phase comparator and filter) while using the output of the voltage-controlled oscillator to generate the recovery windows.

The phase-locked oscillator responds to each pulse in the data pulse stream in preparation for then making a phase comparison between the trailing edge of that pulse and the signal fed back from the voltage controlled oscillator. The raw data pulses, as originally supplied from the recording medium, communications channel, or other source, are typically not suitable for the foregoing purpose, because they are typically in the form of rather short, sharp pulses, providing insufficient time lapse between their leading and trailing edges to enable the PLO to set up and perform the phase comparison, as described above.

It has been known for that reason to use signal processing circuitry in the data input path ahead of the phase comparator in order to stretch the short, sharp original data pulses into longer pulses, with level transitions (edges) positioned in predetermined time relation to the original data pulses. For example, for systems having a nominal minimum interpulse period T of 2 microseconds, circuitry such as a single-shot multivibrator has been used to stretch it into a pulse whose trailing edge occurs 1 microsecond after the leading edge of the original data pulse. However, in addition to performing its intended pulse stretching, such signal processing circuitry also introduces a certain amount of overall delay into the data stream.

Given the circuit configuration of the PLO's heretofore used, it has further been the practice to take those data pulses which are to be actually recovered (by means of the PLO-generated windows) from a point in the data path ahead of the single-shot multivibrator which is used to stretch these pulses before they are applied to the PLO.

As a result of the interposition of the pulse stretcher in the data input path to the PLO, but not in the data input path to the recovery circuitry, there inherently existed a certain amount of differential delay between these two paths (namely between the window-generating data path and the data path which by-passes the window-generating PLO and goes directly to that circuitry which uses the windows to actually recover the data).

To overcome the adverse effect of this inherent differential delay, it has been customary to intentionally introduce a compensating delay into the by-pass path. Such a compensating delay constitutes an expense; indeed, at the time and frequency parameters involved, it constitutes a substantial expense.

Moreover, in order for the data pulses to be ultimately centered within their respective windows for recovery, any such delay in the path followed by the data stream must be capable of fine adjustment, and must actually be subjected to such adjustment during construction of the equipment. This further adds to the expense.

Worst of all, no matter how perfectly such delay is initially adjusted, and no matter how stable all circuitry remains with the passage of time, the data pulses are still subject to drifting away from their desired centered positions in the windows, because of possible uncontrollable changes in the frequency of the data stream. Such changes in frequency can arise from various causes, such as speed changes in the transport mechanism of the recording or playback apparatus. As this frequency varies, the phase shift corresponding to a given time delay will also vary, and this will cause the positions of the by-passed data pulses to vary relative to their recovery windows, and particularly to deviate from their desired centered positions within these windows.

Such deviations from center adversely affect the reliability of data recovery or, to put it another way, increase the error rate. This adverse effect mounts as the magnitude of the frequency deviations increases. Moreover, the sensitivity to such deviations goes up as more sophisticated codes are used, with increased data packing densitities.

Not only are the tolerances inherently smaller for more densely packed data, but the nature of the more sophisticated codes is such that more sophisticated measures must be employed for their recovery, and these are also subject to tighter tolerances.

Again using the M²FM code as an example, this benefits from the use of windows for data recovery from the data stream which are of unequal lengths (hereafter called non-symmetrical windows). The windows which are used to recover the ones are preferably longer than those used to recover the zeros (i.e. the clock information). Preferably, those two types of windows have durations which are in a 60/40 ratio. In other words, they occupy, respectively, 60 and 40 percent of one bit interval T. The production and use of such non-symmetrical windows places further demands on the maintenance of accurate data centering, thereby again increasing the sensitivity to unwanted frequency changes.

It should be noted that the same kind of problems, attributable to differential delay between the two signal paths, may also arise if the implementation of the over-all recovery system is such that the signal by-pass path, rather than the PLO path, has the inherently greater delay.

Accordingly, it is an object of the invention to provide a data recovery system which is less subject to the problems caused by differential delay between the two signal paths leading to the actual recovery circuitry.

It is another object to provide such a data recovery system which is less subject to the problems caused by delay in the input signal processing logic to the phase-locked oscillator.

It is another object to provide such a system which does not require a compensating delay in the data by-pass path.

It is another object to provide such a system which requires no adjustable delay in the system.

It is another object to provide such a system which is especially suited to the more sophisticated codes.

It is another object to provide such a system which is particularly suited to working with non-symmetrical windows as preferred for recovery of M²FM encoded signals.

It is another object to provide such a system which is particularly suited for the recovery of densely packed, M²FM encoded data.

These and other objects which will appear are achieved in accordance with the invention by providing a circuit configuration for the window-generating circuitry, which makes it possible to connect the input data stream by-passing the PLO to the actual data recovery circuitry, without utilizing a compensating delay in the by-pass path, and without need for delay adjustment.

More particularly, the by-pass path for this input data stream is supplied with an input signal whose time-varying characteristics are kept precisely in step with the time-varying characteristics of that data-derived input signal which is supplied to the PLO phase comparator itself.

This input to the phase comparator itself takes place after whatever signal processing (e.g. pulse stretching) is performed on the data stream. The by-pass is likewise supplied with a signal which has been subjected to exactly the same signal processing. In this way, any need to provide compensating delay in the by-pass path is eliminated. Also eliminated is the need for delay adjustment to achieve centering of data pulses within recovery windows, and the danger of deviations from such centering due to frequency changes.

The window-forming circuitry, and the data recovery circuitry for using these windows to operate on the by-passed data stream are constructed to cooperate with the PLO embodying the invention.

In the preferred form of the invention, non-symmetrical windows are produced and utilized for the recovery of M²FM encoded data.

For further details, reference is made to the discussion which follows, in the light of the accompanying drawings, wherein.

In all the figures, the same reference numerals are used to designate corresponding elements.

Arrows denote the directions of signal flow between circuit elements.

In the timing and waveform diagrams, time runs from left to right across the page.

Figure 1:
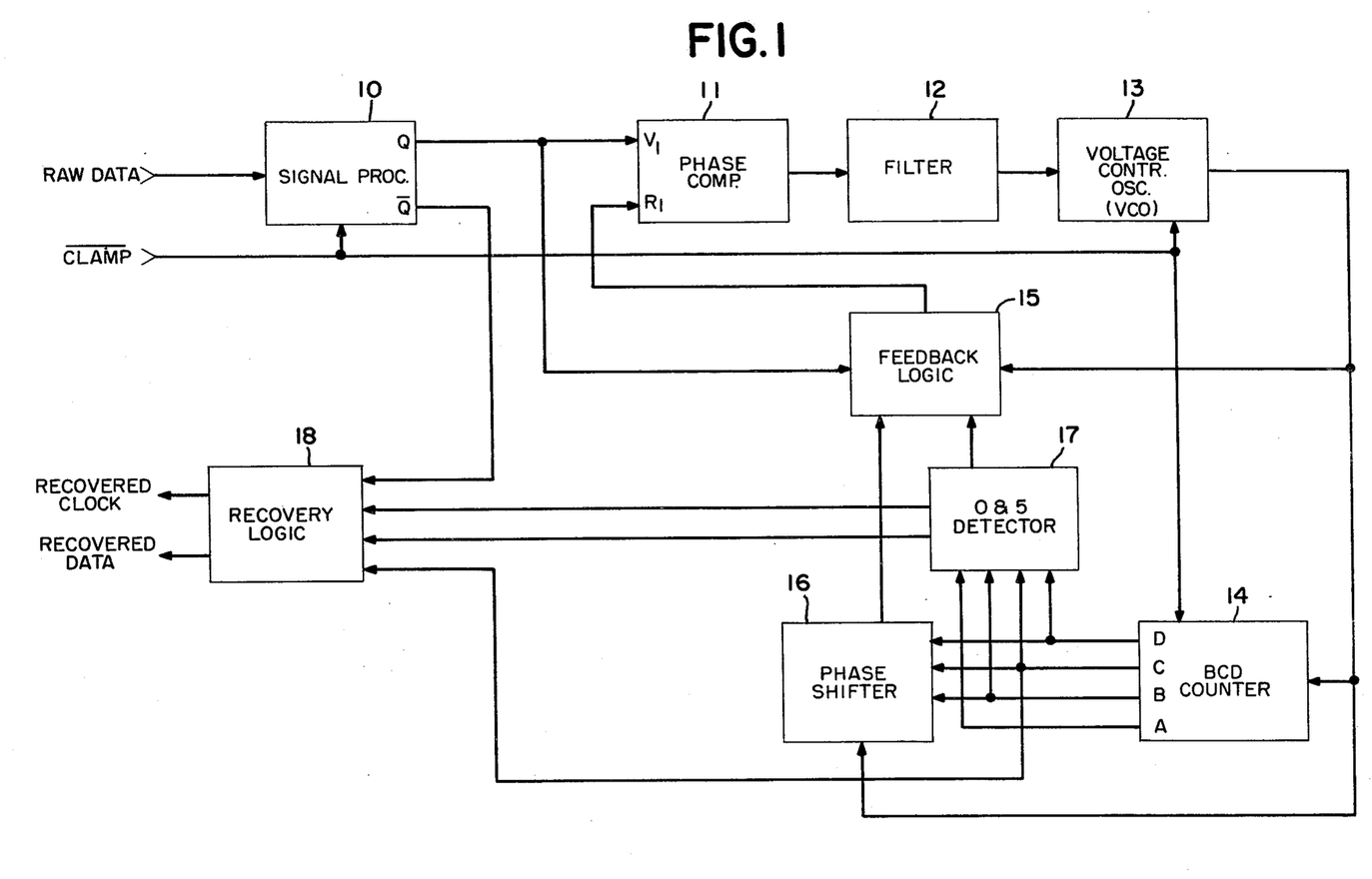
FIG. 1 is a block diagram of the over-all system embodying the invention.

Referring to FIG. 1, this shows an embodiment of the invention particularly designed to recover data encoded in M²FM format. Such data are shown reaching the circuitry of FIG. 1 at the input to signal processing circuit 10.

Figure 2:
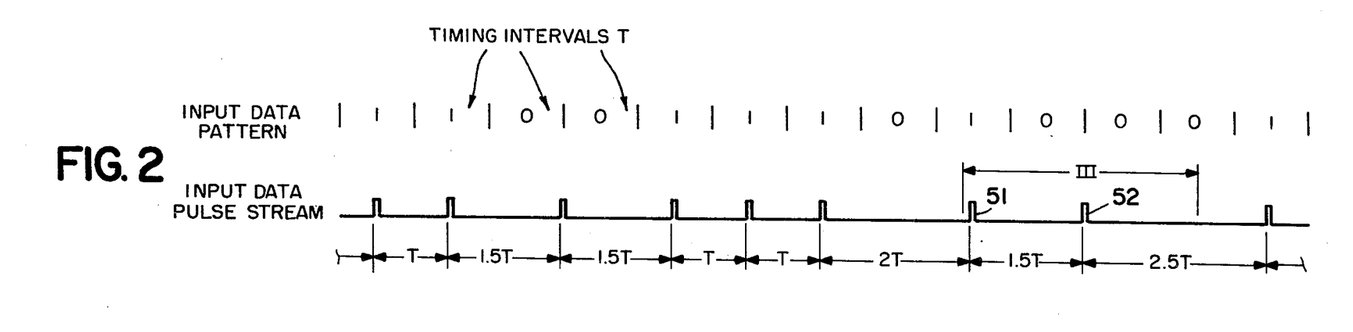
FIG. 2 is a timing and waveform diagram showing the raw data in M²FM encoded format.

The typical form of the raw data input signal to circuit 10 is illustrated in FIG. 2. On the upper line of FIG. 2 are shown consecutive timing intervals (sometimes referred to as bit cells) each of duration T, which may in practice be 2 microseconds long. Within these timing intervals there are inserted in FIG. 2 the binary characters assumed to be represented therein. Thus, in the first interval, there is assumed to be a one, in the second also a one, in the third a zero, and so forth across the page. The lower line of FIG. 2 then shows the electrical signal pulses which correspond to the upper line one-and-zero pattern under conditions of M²FM encoding. It is a signal like that on the lower line of FIG. 2 which is actually applied to signal processing circuit 10 in FIG. 1. However, it will be understood that the positions of the pulses with respect to the timing intervals will in practice deviate from those theoretically intended, due to all sorts of factors, including peak-shift between adjacent pulses, noise, bandwidth limitations, variations in the speed of the recording or playback apparatus, and so forth. It is these deviations which give rise to the need for a sophisticated recovery scheme, such as in this invention.

Turning back to FIG. 1, and focusing for the moment on voltage-controlled oscillator (VCO) 13, this oscillator is conventionally constructed to produce a signal which is essentially a square wave at a harmonic of the recurrence rate of the timing intervals of the M²FM encoded input signal. For reasons which will appear, a multiple of ten is preferred, but others can be used.

Figure 3:
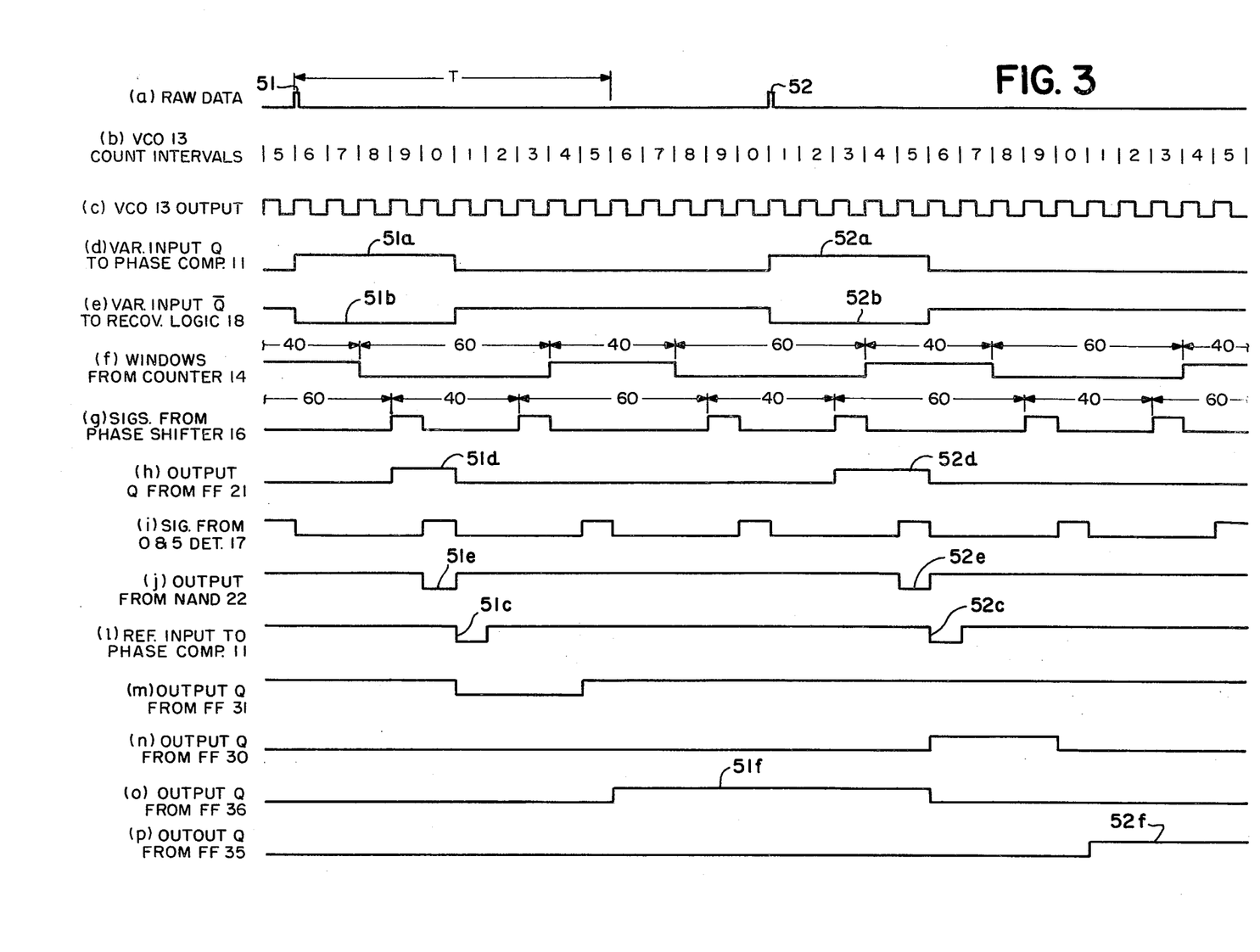
FIG. 3 shows the signal waveforms at various points within the system of FIG. 1.

FIG. 3 shows, in line (c), this VCO output signal. For convenient analysis there is also shown in FIG. 3, namely on line (a) thereof, a portion of the input signal represented on the lower line of FIG. 2, namely that dimensioned as interval III in FIG. 2. It includes two pulses 51 and 52. These are typical in that pulse 51 corresponds to a one, while pulse 52 corresponds to the boundary of two consecutive zero-representative intervals.

Also shown in FIG. 3, on line (b) positioned between lines (a) and (c), is a diagram subdividing each two-microsecond interval T of line (a) into 10 200-nanosecond "count" intervals, numbered recurrently from 0 to 9, and corresponding to the occurrence of the square waves at ten-fold frequency produced by VCO 13 of FIG. 1.

The signal processing circuit 10, to which the input signal shown in FIG. 3, line (a), is applied, may be of any conventional form such as a single-shot multivibrator, capable of stretching the input pulses applied thereto. The Q and $\overline{Q}$ outputs from this circuit 10 are shown on lines (d) and (e) of FIG. 3, respectively. Each input pulse is shown stretched over one-half the interval T, i.e. over 1 microsecond. The stretched Q output pulses corresponding to input pulses 51 and 52 are designated 51a and 52a, respectively, and the $\overline{Q}$ pulses 51b and 52b.

The Q output pulses are applied directly to the $V_1$ input of phase comparator 11 and the $\overline{Q}$ output pulses directly to one input of recovery logic circuitry 18.

Phase comparator 11 may be a Motorola model MC4044 integrated circuit, which also includes a charge pump, coupled as shown in the drawing.

Applied to the $R_1$ input of this phase comparator 11 is a feedback signal derived form VCO 13 via feedback logic circuitry 15, in a manner more fully described below. Suffice it to say, at present, that it is the object of the PLO including its phase comparator 11, filter 12, VCO 13 and feedback logic 15, to establish and maintain the closest possible synchronism between the $V_1$ and $R_1$ inputs to phase comparator 11. The phase comparator functions in this way. Any time displacement which does occur between high-low transitions in the $V_1$ (i.e. variable) input and the $R_1$ (i.e. reference) input to the phase comparator produces, at the output of the charge pump forming part of circuit 11, a phase error signal representative of such time displacement. Through conventional filter 12, this phase error signal is applied to VCO 13, to control the frequency of the latter in conventional manner.

In accordance with conventional practice, the gain and bandwidth of filter 12 is set to respond to long-term drift of the input data pulse stream, over several periods T thereof, and not to respond to instantaneous jitter due to noise or individual bit shift.

In addition to being supplied to feedback logic 15, the output from VCO 13 is also supplied to BCD counter 14 and phase shifter 16.

The BCD counter 14 counts recurrently from 0 to 9 in response to successive pulses from VCO 13. In so doing, counter 14 produces the actual recovery windows and also produces an auxiliary control signal for the feedback logic, via 0 and 5 detector 17.

The phase shifter 16 produces an additional auxiliary control signal for feedback logic 15.

Figure 4:
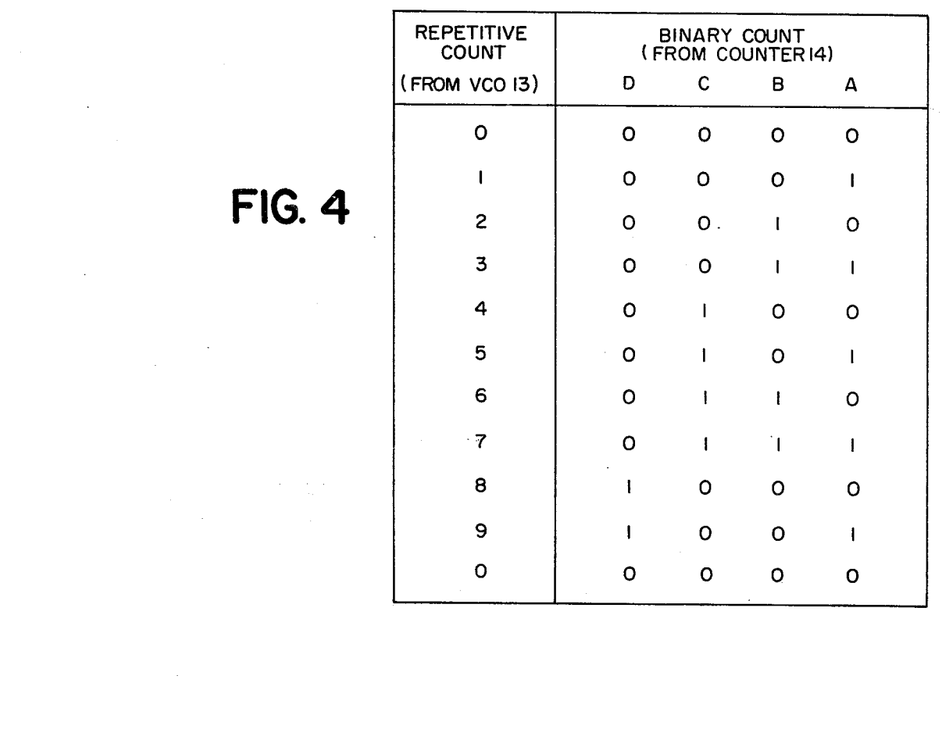
FIG. 4 shows the relationship between input and output signals for the BCD counter which forms part of the system of FIG. 1.

FIG. 4 shows the pattern of outputs from BCD counter 14, produced at its terminals A through D in response to the VCO input signals.

From FIG. 4, it is further apparent that the counts 8 through 3 will produce one level at output terminal C, and the counts 4 through 7 the other level. These two intervals are in a 60/40 relationship. Thus, at terminal C 60/40 signals suitable as the non-symmetrical windows are produced. These output signals at terminal C of counter 14 are shown in FIG. 3 on line (f). Note the non-symmetrical, 60/40 relationship between durations of its negative and positive segments. This is the preferred window configuration for M²FM encoded signal recovery, as previously explained. This is also the signal supplied for that purpose to a second input of recovery logic 18 in FIG. 1 (the first being supplied with the signal shown in line (e) of FIG. 3).

Figure 5:
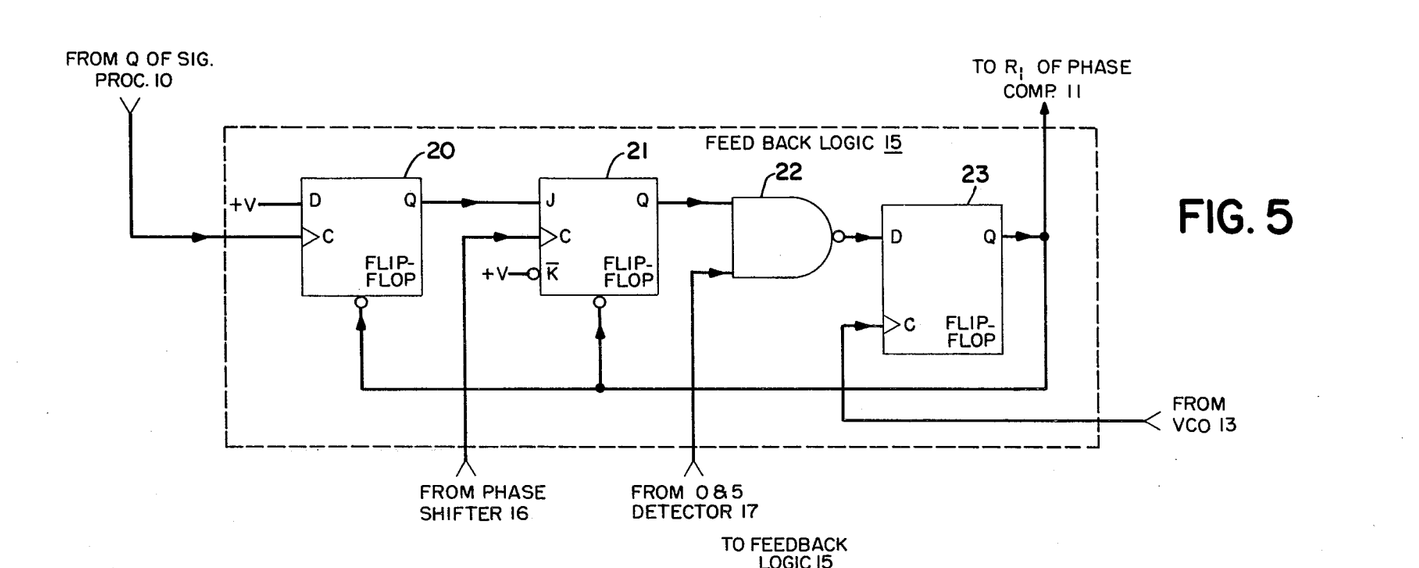
FIG. 5 shows the logic elements which make up the feedback logic of FIG. 1.

Turning now to feedback logic 15, the constituents of this logic circuitry are shown in FIG. 5. This includes three flip-flops 20, 21 and 23, and a NAND gate 22, connected as shown to each other and to the circuitry outside logic 15.

The stretched input signal from the same Q output of signal processor 10 which feeds $V_1$ of phase comparator 11 is aslo connected to clock the flip-flop 20, which is reset by the next following phase comparator $R_1$ input signal feedback from the output of logic 15. The resultant output pulse at Q of flip-flop 20 is further transferred to the Q output of flip-flop 21 by clocking with a signal derived from BCD counter 14 via phase shifter 16. As explained more fully hereafter, this clock signal applied to flip-flop 21 of feedback logic 15 consists of pulse pairs whose leading edges are displaced in time in the same 60/40 relationship as the rectangular wave output from terminal C of BCD counter 14. However, due to phase shifter 16, the 60/40 spacings in this signal are displaced in phase by a suitable amount, preferably 180°.

Figure 6:
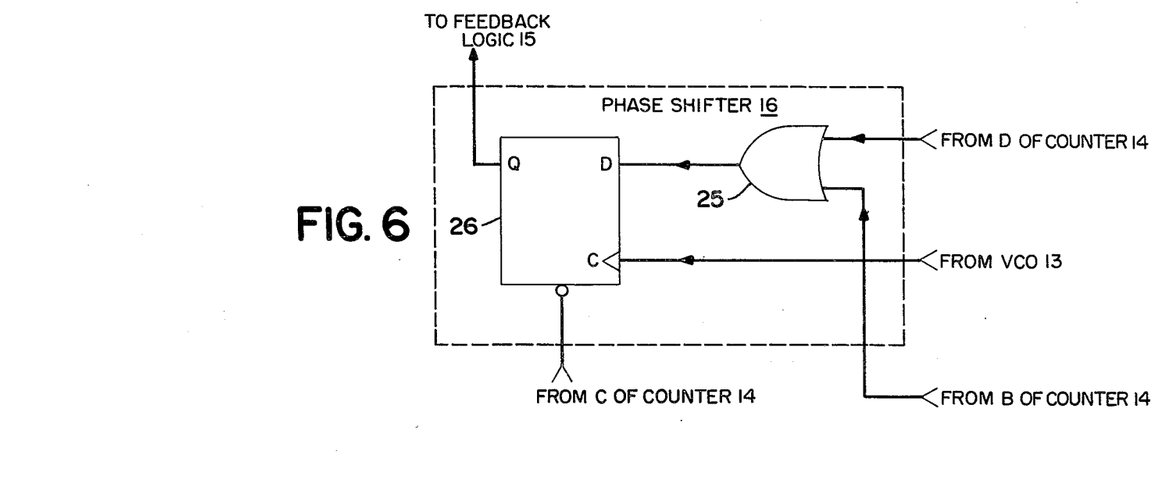
FIG. 6 shows the logic elements which make up the phase shifter of FIG. 1.

This 180° phase shifted series of pulse pairs is shown on line (g) of FIG. 3. Referring to phase shifter 16 shown in datail in FIG. 6, this includes an OR gate 25, supplied with the B and D outputs from counter 14 and, in turn, producing the input signal to flip-flop 26, whose clock input is the VCO output signal, and whose reset input is the 60/40 signal from counter terminal C. It will be readily seen that these components cooperate to produce at the Q output of flip-flop 26 the desired pulse pairs, with spacing in 60/40 relationship, but displaced in phase by the desired 180°. Note that each 60 percent space between leading edges of a pulse pair is centered in the same place as the original 40 percent windows (line (f) in FIG. 3), and vice versa.

Returning now to FIG. 5, and the feedback logic 15 shown in detail therein, the Q output from fli-flop 21 is gated through NAND circuit 22 by the next following signal from BCD counter 14 representing either a count of 0 or a count of 5. To this end, the four output terminals of the counter 14 are connected to 0 and 5 detector 17. This detector may take any conventional form of digital logic circuitry for sensing the 0 and 5 count configurations respectively of the counter output signals (see output patterns shown in FIG. 4) and to combine these to produce a gating signal for NAND gate 22 in response to each 0 and 5 count.

Finally, the output from gate 22 is supplied to flip-flop 23, through which it is clocked by the VCO 13 output signal. The Q output from flip-flop 23 constitutes the reference signal applied at $R_1$ to phase comparator 11.

This Q output from flip-flop 23 is shown in line (1) of FIG. 3 and will be seen to have high-low transitions 51c and 52c which coincide with the high-low transitions in the variable inputs 51a and 52a, respectively, to $V_1$ of phase comparator 11, as desired for proper operation of the system.

The signal modifications thus taking place within feedback logic circuit 15 are shown in lines (h) to (j) of FIG. 3.

Before discussing these lines (h)-to-(j) signals, it is noted that the signal supplied from the Q output of flip-flop 20 to the J input of flip-flop 21 of logic 15 has its high-low transitions time-aligned with the high-low transitions in the signal shown on line (d) of FIG. 3, i.e. has high-low transitions corresponding to those of pulses 51a and 52a.

In flip-flop 21, the clocking action of the signal from phase shifter 16 (line (g) of FIG. 3) cooperates with the reset action of the signal from flip-flop 23 to produce the Q output shown on line (h) of FIG. 3. Note that the positive-going pulse 51d in this Q output signal, which corresponds to variable signal 51a is 400 nanoseconds long, whereas the positive-going pulse 52d which corresponds to variable signal 52a is 600 nanoseconds long. However, each of these two pulses has its negative-going (trailing) edge aligned with the corresponding variable pulse, the difference in duration being absorbed in different timing of their leading edges.

The significance of the 180° phase shift produced by phase shifter 16 now becomes apparent. In the absence of phase shifter 16 each low-high transition of the variable phase comparator input from Q of processing circuit 10—after passage through flip-flop 20—would be clocked through flip-flop 21 by the start of the next succeeding window from BCD counter terminal C. However, comparison of lines (d) and (f) in FIG. 3 shows that (again in the absence of phase shifter 16) the window accompanying such a low-high transition in a data pulse 51a is a 40 percent window, while that accompanying a low-high transition in a clock pulse 52a is a 60 percent window. This is the exact reverse of the desired condition, in which the data (ones) transitions are to accompany the 60 windows and the clock transitions the 40 windows. This is corrected by the 180° phase shifter 16. By virtue of its operation, the pulse 51a transition is clocked through the flip-flop 21 by a 60 window, and the pulse 52a transition by a 40 window.

The NANDed signals 51e and 52e then produced by gate 22 are shown on line (j) of FIG. 3. Note that the above-mentioned discrepancy between the lengths of pulses 51d and 52d is no longer in evidence in pulses 51e and 52e.

The significance of supplying the 0 and 5 outputs from 0 and 5 detector 17 to this NAND gate 22 now becomes apparent. The transition in the 0-to-1 count produced by BCD counter 14 corresponds to the center of the 60 percent window produced by the same counter, and the transition in the 5-to-6 count to the center of the 40 percent window. Thus, the NAND gate will be gated at the centers of these respective intervals due to the simultaneous presence of the 0 or 5 count transitions (see line (i) of FIG. 3) and the flip-flop 21 output transitions (see line (h) of FIG. 3).

Finally, with respect to the Q output from flip-flop 23 which, as previously emphasized, constitutes the reference feedback from VCO 13 to phase comparator 11, this is now seen to have its high-low transitions 51c and 52c lined up perfectly in several respects.

Once such respect is the perfect line-up with the high-low transitions of the corresponding variable inputs 51a and 52a to the comparator. This corresponds to a perfectly locked-in condition for the PLO.

Another such respect is the alignment with the centers of the appropriate recovery windows. Thus, reference high-low transition 51c, which corresponds to data one pulse 51, is lined up with the centers of the 60 window (compare lines (l) and (f) in FIG. 3).

On the other hand, reference high-low transition 52c, which corresponds to zeros boundary (i.e. clock) representative pulse 52, is lined up with the center of a 40 window. It can be shown that this condition is essentially independent of deviations of the data frequency from its nominal value. The recovery system problems discussed previously, which otherwise arise from such frequency deviations, are thereby averted.

In terms of the waveform diagrams of FIGS. 2 and 3, such frequency deviations would manifest themselves either by closer spacing of successive raw data pulses (if the frequency goes up) or by wider spacing (if the frequency goes down). This means that the absolute length of the interval T (heretofore assumed to be 2 microseconds) would vary correspondingly. However, the frequency of VCO 13 would vary in the same way, and the new interval T would still be divided into two window portions in 60/40 relationship due to the inherent operation of the window-forming BCD counter 14. All the other timing functions would continue to be performed in the same way, but at instants correspondingly repositioned with respect to the new interval T and the new 60/40 windows.

The by-pass of variable information from signal processing circuit 10 output $\overline{Q}$ to recovery logic 18 is not subjected to any differential phase shift because there is nothing capable of producing such phase shift in the by-pass path. Therefore the centered positions of these data in the windows remains undisturbed by the frequency change.

It is also noted that the actual feedback path from the output of VCO 13 to the reference input $R_1$ of phase comparator 11 has been reduced to a single flip-flow 23. All the other control functions influencing this feedback, i.e. those performed by circuits 20, 21, 22, and the signals driving same, have been taken out of the actual feedback path. This brings the feedback delay essentially down to its irreducible minimum and further improves the proper functioning of the system.

Although not bearing directly on the foregoing advantages, it is also noteworthy that the invention provides a PLO whose VCO 13 is not pulled off frequency, despite the fact that the actual data are non-periodic, due to the M²FM code format. In the present invention, no phase comparator reference feedback is supplied except when a data-derived variable input is actually present. Therefore, during missing variable inputs, there is no pulling of the VCO frequency. Of course, the system works also with strictly periodic input signals.

Figure 7:
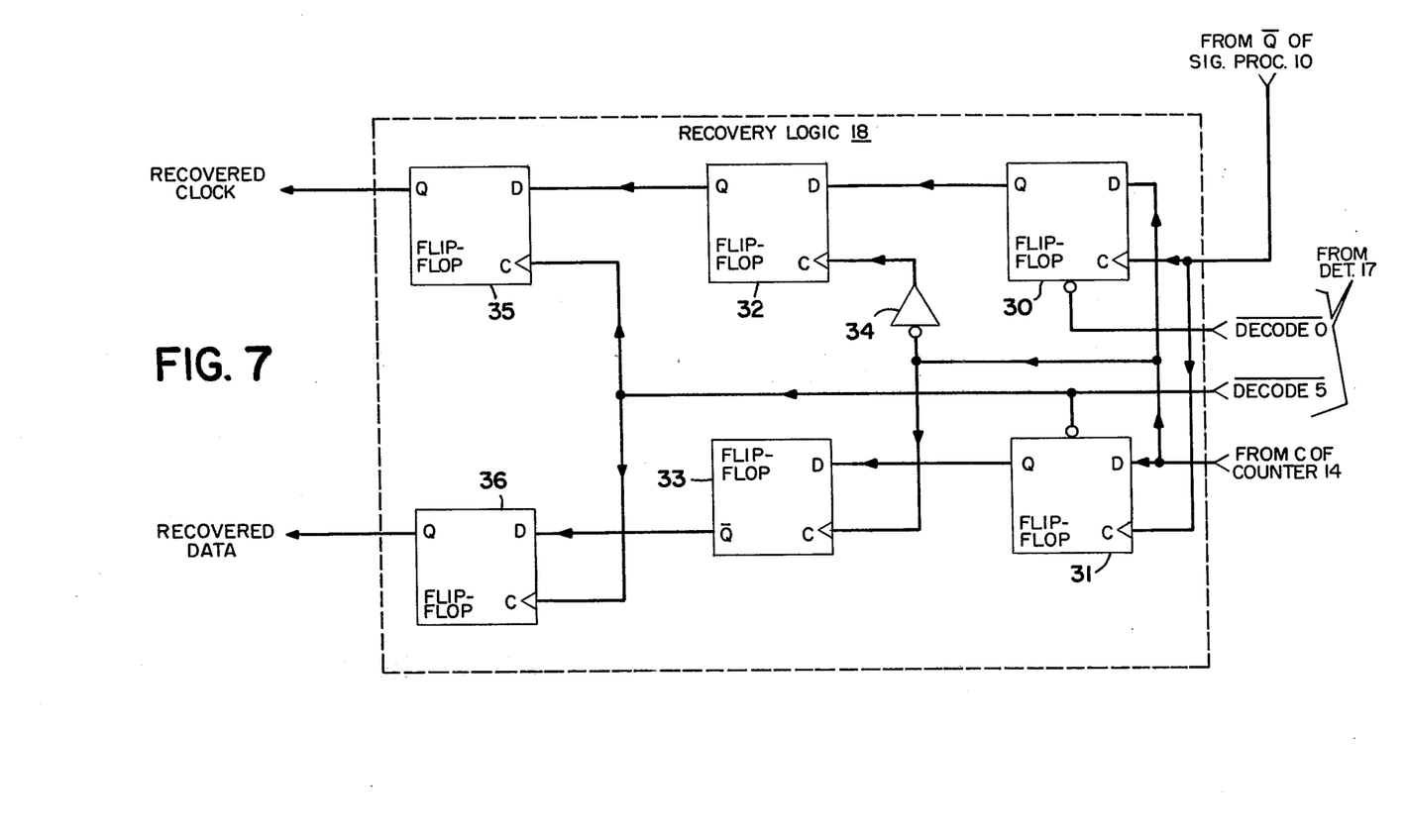
FIG. 7 shows the logic elements which make up the recovery logic of FIG. 1.

Now that, by virtue of the apparatus heretofore described, there are reliably present data-representative signals centered within the derived recovery windows, it remains to actually recover the data. This is accomplished in recovery logic 18, whose internal circuit configuration is shown in FIG. 7.

As shown in that figure, the $\overline{Q}$ (data representative) signals from pulse stretcher 10 are applied to the clock inputs c of two flip-flops 30 and 31. To the data inputs D of the same flip-flops are applied the 60/40 windows from terminal C of counter 14. The reset input to flip-flop 30 is the 0 count from the counter 14 as derived via 0 and 5 decoder 17, but inverted in polarity as indicated by $\overline{DECODE\ 0}$ in FIG. 7. This reset input to flip-flop 31 is the 5 count, also polarity inverted as indicated by $\overline{DECODE\ 5}$ in FIG. 7.

The Q outputs of flip-flops 30 and 31 are supplied to respective D inputs of two more flip-flops 32 and 33, whose C inputs are supplied with C terminal output signals from counter 14, except that this C input to flip-flop 32 passes first through an inverter 34 before reaching flip-flop 32.

Finally, the Q output from flip-flop 32 is supplied to the D input of another flip-flop 35, the $\overline{Q}$ output from flip-flop 33 is supplied to the D input of still another flip-flop 36, and the C inputs of both flip-flops 35 and 36 are supplied with the same $\overline{DECODE\ 5}$ input from 0 and 5 detector 17.

On line (m) of FIG. 3 is shown the signal produced at the Q output of flip-flop 31, and on line (n) that produced at the Q output of flip-flop 30. Note a low interval of 800 nanoseconds in (m) and a high interval of the same duration in (n). These represent what might be called rudimentary forms of the recovered information represented by the pulses 51 and 52 in line (a) of FIG. 3.

On lines (o) and (p) of FIG. 3, are shown, respectively, the final output signals from flip-flops 36 and 35, respectively.

The signal on line (o) is the recovered data signal. Its high portion 51f corresponds to the one-representative pulse 51 of line (a) in FIG. 3, and of FIG. 2. It has a duration of T (2 microseconds) and it is flanked, as it should by, by low portions corresponding to zeros in the raw data.

The signal on line (p) is the recovered clock signal. Its high portion 52f corresponds to the clock-representative pulse 52 of line (a) in FIG. 3, and of FIG. 2.

Limitations of space in FIG. 3 preclude showing other portions of the recovered signals corresponding to the data stream of FIG. 2, but these would likewise have the appropriate data and clock-representative content.

The insensitivity of this system to frequency deviations of the input data stream is again emphasized. Such deviations correspond to a change in the absolute value of the interval T of FIGS. 2 and 3. However, all the timing relationships within these figures then simply adapt to the now absolute value of T and the relative positionings of all the significant events remain undisturbed.

The further utilization of the recovered signals produced by logic 18 may take place in conventional manner and is therefore not further discussed.

The discussion heretofore presented has assumed that the system of FIG. 1 is already in a steady-state mode of operation, with data being applied to the signal processing circuit 10, and the various other timing and counting operations progressing accordingly.

This condition may be established, following turn-on of the system, in any desired manner, involving, for example, the $\overline{CLAMP}$ signal shown applied to circuit 10 and also to VCO 13 and counter 14 in FIG. 1.

Initially, there is supplied to circuit 10, in lieu of the regular data stream, a signal from a local crystal oscillator (not shown) at a frequency corresponding to the nominal interval T. While this is happening, the $\overline{CLAMP}$ signal is maintained at high level.

The received data stream typically contains a preamble consisting of a sequence of 1 bits, each spaced at interval T from adjacent bits. After the PLO has settled into a quiescent state in response to the crystal oscillator pulses, the crystal oscillator is disconnected from the input to circuit 10 and replaced by the data stream preamble. At the instant of applying the first preamble pulse, the $\overline{CLAMP}$ signal is also switched to low level. This disables circuit 10 so that it does not respond to the first preamble pulse. The $\overline{CLAMP}$ signal going low also disables VCO 13 and loads a count of seven into counter 14. At the occurrence of the next preamble pulse, as determined, for example, by coincidence of such a pulse and a delayed replica of the first preamble pulse, the $\overline{CLAMP}$ signal switches back to a high level. This removes the disabling signal from circuit 10, but not in time for it to respond to the instant preamble pulse. The $\overline{CLAMP}$ signal going high also removes the disabling signals from VCO 13, permitting it to start oscillating after a delay of one cycle. Texas Instruments Model 74S124 voltage controlled oscillator functions in this manner. Thereafter, additional preamble pulses are applied to circuit 10, and the PLO responds as previously explained for data recovery, with the signal at the output of filter 12 again settling at quiescent value corresponding to the interval T for the preamble pulses. After a predetermined number of preamble pulses the PLO is then ready for recovery of data pulses.

It will be understood that the invention is not limited to the particular signal configurations shown, nor to the particular circuitry embodiment. Rather is encompasses the broad concept of producing data recovery windows within which the data-representative signal parameters are maintained centered, without compensating delay, and despite frequency deviations.

Many modifications will occur to those skilled in the art without departing from the inventive concept. For example, the use of a VCO at 10 times the nominal data rate is not essential. Other multiples could be used. A multiple of 10 is convenient for producing 60/40 windows. For other codes different non-symmetry might be preferably and this could, in turn, make it more convenient to use a different VCO multiple.

Likewise, the particular value of phase shift introduced by phase shifter 16 is not necessarily 180° in every application of the invention.

In the embodiment described, the signal processing circuit 10 stretches the data stream pulses by 1 microsecond, before they are applied to input $V_1$ of phase comparator 11 of FIG. 1. This stretching corresponds to one-half the 2 microsecond timing interval T occupied by each data bit. In frequency domain terminology, this is the equivalent of a 180° phase delay, with respect to the nominal frequency of the bit stream. This is what makes it appropriate to provide a 180° phase shifter in the system of FIG. 1. By using such a 180° phase shift, the data ones bits will be clocked through to control the PLO feedback by 60 windows, and the clock bits by 40 windows, as previously explained.

If a different amount of pulse stretching were used, the phase shift provided by phase shifter 16 would have to be changed appropriately, so as still to produce the foregoing interaction between the data stream components and the respective windows.

I claim:

1. In a system for recovering encoded binary information which is represented in a data stream at time positions recurring at a frequency that is nominally predetermined but subject to uncontrollable deviations, the system including means for generating signals having alternating high and low portions for use as recovery windows, recovery logic supplied with said windows, and a phase locked oscillator loop controlled by a phase comparator and determining the times of occurrence of the windows, the phase comparator having supplied to it two comparison signals, one being the feedback signal within the loop and the other being a signal derived from the data stream, the improvement which comprises
means for supplying to the recovery logic a signal also derived from the data stream and having information representative time-varying characteristics which occur substantially concurrently with corresponding time-varying characteristics of the said signal derived from the data stream which is supplied to the phase comparator, and which do so occur substantially independently of said frequency deviations.

2. The system of claim 1 comprising the further improvement that the recovery window generating means and the phase locked oscillator are constructed so that the same time-varying characteristics in the signal supplied to the recovery logic from the data stream are substantially centered within recovery windows, substantially independently of said frequency deviations.

3. The system of claim 2 wherein the means for supplying the signal derived from the data stream to the recovery logic includes signal processing means for producing stretched replicas of pulses in the data stream.

4. The system of claim 3 wherein the means for supplying the comparison signal derived from the data stream to the phase comparator also includes signal processing means for producing stretched replicas of pulses in the data stream.

5. The system of claim 4 wherein the signal processing means stretches both replicas by substantially the same amounts.

6. The system of claim 5 wherein the signal processing means is a single-shot multivibrator producing both stretched replicas.

7. The system of claim 6 wherein the stretched replicas are produced at the $\overline{Q}$ and Q outputs of the multivibrator, respectively.

8. The system of claim 5 wherein the output signals of the pulse stretching means are supplied to the recovery logic without intervening delay means.

9. The system of claim 8 wherein the phase locked oscillator loop comprises a voltage controlled oscillator operating at a harmonic of the recurrence frequency of the information representative time positions.

10. The system of claim 9 wherein the window producing means includes a counter supplied with the output from the harmonic oscillator and responsive thereto to produce corresponding counts, recurring at a periodicity equal to that of the recurrence period of the information time positions in the data stream.

11. The system of claim 10, wherein the counter means includes means for producing an output signal having within each recurrence period a high and a low portion, respectively coinciding with predetermined series of counts.

12. The system of claim 11, comprising means for supplying the said high and low counter output signal portions to the recovery logic as the recovery windows.

13. The system of claim 12, wherein the recovery logic includes means for utilizing the recovery windows and the output signals of the pulse stretching means to recover the information encoded in said output signals.

14. The system of claim 13, wherein the recovery logic includes means for utilizing one window in each recurrence period to recover the ones and zeros encoded in the output signals, and the other window to recover the encoded clock.

15. The system of claim 14, wherein the recovery logic includes two signal paths, each supplied with the pulse stretching means output signals and the recovery windows, and respectively supplied with signals representing the centers of one and the other window.

16. The system of claim 12, wherein the counter means is constructed to produce the high and low signal portions with unequal durations.

17. The system of claim 11, wherein the data stream is $M^2FM$ encoded and the durations of the high and low signal portions are in a 40/60 ratio.

18. The system of claim 16, wherein the phase locked oscillator loop comprises feedback logic supplied with the output signal from the voltage controlled oscillator.

19. The system of claim 18, comprising means for deriving first and second auxiliary signals from the counter means, the first auxiliary signal having transitions phase shifted from those of the recovery windows by a predetermined amount, the second having transitions coinciding with the centers of the respective recovery windows.

20. The system of claim 19, wherein the data stream is $M^2FM$ encoded, and the transitions in the first auxiliary signal are phase shifted by 180°.

21. The system of claim 19, comprising means for applying the first auxiliary signal to the feedback logic to clock a signal derived from that comparison signal supplied to the phase comparator which is derived from the data stream.

22. The system of claim 21, wherein the feedback logic includes a flip-flop to which the first auxiliary signal is applied as the clock and which is reset by the same signal which is supplied to the phase comparator as its feedback comparison signal.

23. The system of claim 21, comprising means for applying the second auxiliary signal to the feedback logic to gate the signal clocked by the first auxiliary signal.

24. The system of claim 23, wherein the feedback logic includes a NAND gate to which the signal clocked by the first auxiliary signal and the second auxiliary signal are both applied, and a flip-flop supplied with the output sugnal from the NAND gate, and with the voltage controlled oscillator output as the clock.

25. The system of claim 24 wherein the output signal of the last-named flip-flop constitutes the feedback logic output signal and is supplied to the phase comparator as its feedback comparison signal.

* * * * *